FAST RESPONDING SEMICONDUCTOR DEVICE USING LIGHT AS THE TRANSPORTING MEDIUM

Filed Nov. 23, 1962

INVENTOR
RICHARD F. RUTZ

BY John F. Ohlandt Jr.

ATTORNEY 3,369,133
FAST RESPONDING SEMICONDUCTOR DEVICE USING LIGHT AS THE TRANSPORTING MEDIUM

Richard F. Rutz, Cold Spring, N.Y., assignor to International Business Machines Corporation, New York, N.Y., a corporation of New York Filed Nov. 23, 1962, Ser. No. 239,434
8 Claims. (Cl. 307—299)

This invention relates to signal translating devices utilizing semiconductor bodies and in particular to such devices involving recombination radiation.

It has previously been discovered that in certain semiconductor materials which are appropriately doped, that is, contain impurities at prescribed levels, and with a bias supplied to a junction that is formed in these materials, efficient light emission may be obtained due to recombination radiation. For a discussion of the subject, reference may be made to an article by R. J. Keyes and T. M. Quist in the Proceedings of the IRE, vol. 50, page 1882 (1962).

Recombination radiation, as that term is understood in the semiconductor art, refers to a phenomenon where charge carriers, that is, holes and electrons, recombine and produce photons. The recombination process, per se, involves annihilating encounters between the two types of charge carriers within a semiconductor body whereby the carriers effectively disappear. Certain kinds of recombinations have been known to produce radiation, but, until recently, such radiation has been inefficiently produced.

It is a primary object of the present invention to exploit this newly discovered, highly efficient recombination radiation phenomenon in certain semiconductor materials and this primary object is attained by the provision of a signal translating device which can be most easily described by using transistor nomenclature since the "black box" description in terms of currents and potentials at the accessible terminals is quite similar to the well established transistor characteristics.

Transistors, as they have become known in the past decade or so, have found wide application as signal translating devices such as in amplifiers, oscillators, modulators, etc. The earliest type of transistor was that known as a point contact transistor. More prominently utilized today is the type known as a junction transistor wherein several junctions are defined by contiguous regions within the semiconductor body which vary in conductivity type. Usually this variation is an alternation between what is known as p conductivity type wherein the majority carriers are holes and n conductivity type wherein the majority carriers are electrons.

In general, semiconductor devices have involved injection of carriers into a region or regions within the semiconductor body. These injected carriers are of a sign opposite those normally present in excess within the region. Injection is an operating feature of the conventional junction transistor wherein minority carrier injection is controlled in accordance with signals to be translated. The injected minority carriers diffuse through the base zone over to a collecting junction where they affect the current flow of the collecting junction. Power amplification is obtainable in a load circuit associated with the collecting junction. Voltage and current gain may also be realized.

Except for the acceleration of carriers through the base zone or region due to the creation of a drift field in certain specialized transistor devices, the movement of carriers occurs solely by diffusion. Since the thickness of the base region determines the transit time of injected minority carriers through the base region (for a given diffusion constant), a severe requirement is imposed on base layer thickness if it is desired to operate at extremely high frequencies.

In accordance with the present invention, the requirement that the base layer be thin can be relaxed and high speed operation can still be obtained due to the fact that light propagates at a much higher velocity than is obtainable by diffusion or drift mechanisms.

A broad feature of the present invention resides in the construction of a signal translating device using light as the transporting medium across the base region, rather than depending upon conventional charge carrier transport. A further feature resides in the provision of a junction, within the same semiconductor material and similar to the emitting junction, serving as an efficient collecting junction. The advantage of construction of the active emitting and absorbing elements in a homogeneous material is that considerable freedom is allowed in fashioning geometries and in controlling the conductivity of the various regions.

Another object of the present invention is to provide a light coupled signal translating device having significant power gain.

A further object is to provide a unique structural configuration for a light coupled device according to which the collector region is concentric with respect to the emitter region.

The foregoing and other objects, features and advantages of the invention will be apparent from the following more particular description of preferred embodiments of the invention, as illustrated in the accompanying drawings.

In the drawings.

Figure 1:
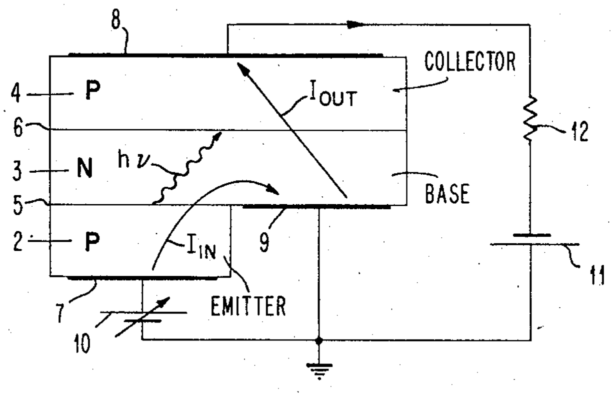
FIGURE 1 is a schematic diagram of a signal translating device, in accordance with the present invention, connected in circuit.

Referring now to FIGURE 1 there is shown a semiconductor body generally denoted by the numeral 1 comprising a first region 2, a second region 3 and a third region 4. In accordance with conventional transistor nomenclature the first region 2 shall hereinafter be referred to as an emitter region, the second region 3 as a base region and the third region 4 as a collector region. However, these terms should not be confused with those terms which are used to describe the emission and absorption of photons which occur in accordance with the operation of the device of the present invention. Regions 2 and 3 define a junction 5 at or near which emission of radiation occurs in accordance with prescribed conditions. Regions 3 and 4 define a second junction 6 at or near which absorption of photons and their conversion to charge carriers occurs.

The semiconductor body 1 is provided with the regions 2, 3 and 4, which alternate in conductivity type. An original semiconductor wafer for example, having 6 mil thickness, is selected to be of n conductivity type and by a typical technique, such as by a diffusion operation using an impurity such as Zn, the regions 2 and 4 are created to be of p conductivity type.

Since it is practicable to have a relatively thick base region, i.e., region 3 in the device of FIGURE 1, the attachment of contacts to the structure is quite simple. Ohmic contacts 7 and 8 are made to the opposite faces of the semiconductor body 1 and ohmic contact 9 may, if desired, be made on the side of the base region 3 so as to allow for a completely symmetrical structure. However, in the illustrative example of FIGURE 1 the contact 9 is shown affixed in one portion of the bottom surface of region 3. This is accomplished simply by first etching away a portion of region 2.

A variable biasing source, shown as battery 10, is connected to ohmic contacts 7 and 9. In the output circuit there is shown another battery 11 connected to the collector region 4 and to the base region 3 by way of ohmic contacts 8 and 9 respectively. A load resistor 12 is employed in the output circuit, as is conventional. An output signal may be taken across this load resistor 12 as is also standard practice.

With the polarities applied as indicated for the voltage sources 10 and 11 a forward bias is imposed on junction 5 and reverse bias on junction 6. Emission and propagation of photons is schematically indicated by the arrow labeled $h_\nu$, current flow for the arrangement of FIGURE 1 by the arrows labeled $I_{in}$ and $I_{out}$.

In the operation of the device of FIGURE 1, with the forward bias imposed on junction 5 injection of charge carriers is produced. Due to the injection of charge carriers recombination radiation then occurs within the GaAs semiconductor body 1 at or near the junction 5. This process of recombination radiation is highly efficient and is thought to approach 100% efficiency in the conversion of injection carriers into photons.

It should be emphasized at this point that the criterion which is normally applied to conventional transistor action is that there be preference for the injection of charge carriers into the base region, that is to say, the one type of charge carrier which is a minority carrier in the base region should be the major contributor to current flow from the emitter to the collector. Hence, great stress is placed upon emitter injection efficiency in conventional transistor design. However, with the instant invention the aforesaid criterion does not necessarily apply since what one wants is highly efficient emission of photons. It is the first instance the emission of photons which determines the overall efficiency of operation of the device of the present invention. It is believed at the present time that the light emission which occurs, for example in the device of FIGURE 1, is due to the fact that electrons are being injected from the n region side of the junction to the p region side and, in combining with holes in the p region, photons are generated. Thus the preference for the injection of minority carriers is in an opposite sense to the case of normal transistor action for a p-n-p structure.

The photons of radiation which travel across the relatively thick base region 3 (thickness of approximately 2 mils) are absorbed upon striking the reverse biased p-n junction and converted into charge carriers. As a result of this conversion current flows through the output circuit as indicated by the arrow labeled $I_{out}$.

The fact that photons can be collected in this manner at a collected p-n junction in a homogeneous body, such as of GaAs, runs counter to prevailing scientific opinion which has considered that such collection would not be appreciable within the very small volume enclosing the junction and limited by the diffusion length for minority carriers.

It has been found that recombination radiation in GaAs occurs with a high degree of efficiency and at a frequency corresponding to an energy less than the band gap energy so that the radiation is not normally expected to be highly self-absorbed by the GaAs itself. In past studies of the effect within the well known semiconductor materials, such as Ge and Si, self-absorption has limited to extremely small values the distances in which appreciable amounts of recombination radiation could be transmitted. The recent discoveries in GaAs have made possible the transmission of large amounts of radiation, generated at a forward biased junction, over relatively large distances within the crystal itself. For instance, the absorption coefficient for 8400 A. radiation in p type GaAs, doped to about $10^{18}$ a./cc., is approximately 100 cm.$^{-1}$ which allows appreciable transmission up to distances of about 0.1 mm. In lighter doped n type materials transmission distances are much longer. Similarly high efficiencies of generation and transmission are obtainable in other semiconductors, notably, in other III–V compounds. Hence, it should be borne in mind that, although the present invention has been referenced specifically to GaAs, other semiconductos are also useful.

Figure 2:
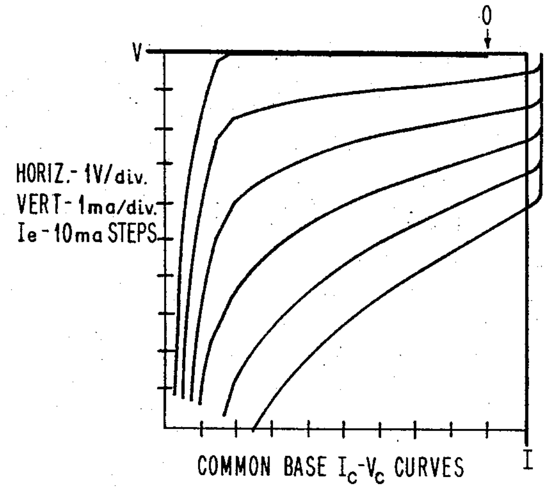
FIGURE 2 depicts a series of I-V characteristic curves for the device of FIGURE 1.

Referring now to FIGURE 2 there is depicted a typical family of VI characteristic curves, taken at liquid nitrogen temperatures, for the device of the present invention, in the common base connection. It will be noted that the origin of the coordinate system is slightly shifted to the left from the furthest extension on the right of some of these curves. The parameter of emitter input current is shown in 10 milliampere steps. The horizontal scale for the graph is one volt/division and the vertical is one milliampere/division. Thus it will be observed that the current gain for a typical case depicted in FIGURE 2 is 0.2. This value is realized for $Vc=6$ volts where it can be seen on the graph that the change in $Ic$ is approximately 2 milliamps for a change of 10 milliamps in $Ie$. Thus $$\frac{dIc}{dIe}=0.2=\alpha$$

Although reference is made above to the symbol $\alpha$ which is a well-known conventional transistor parameter, it is preferable to consider a new symbol $N_0$ for the overall efficiency of the present device. $N_0$ is dependent upon the product of three separate efficiencies $N_1$, $N_2$ and $N_3$. Thus, one may write $N_0=N_1N_2N_3$ where $N_1$ is the efficiency of the recombination radiation due to the injection of charge carriers, $N_2$ is the efficiency of the transport of photons, and $N_3$ is the efficiency of the absorption of photons and conversion to collector current at the output junction. It has been found that an overall efficiency $N_0$ on the order of 20% may readily be obtained. This value of efficiency corresponds to the value of current gain $\alpha$ previously referred to.

Figure 3:
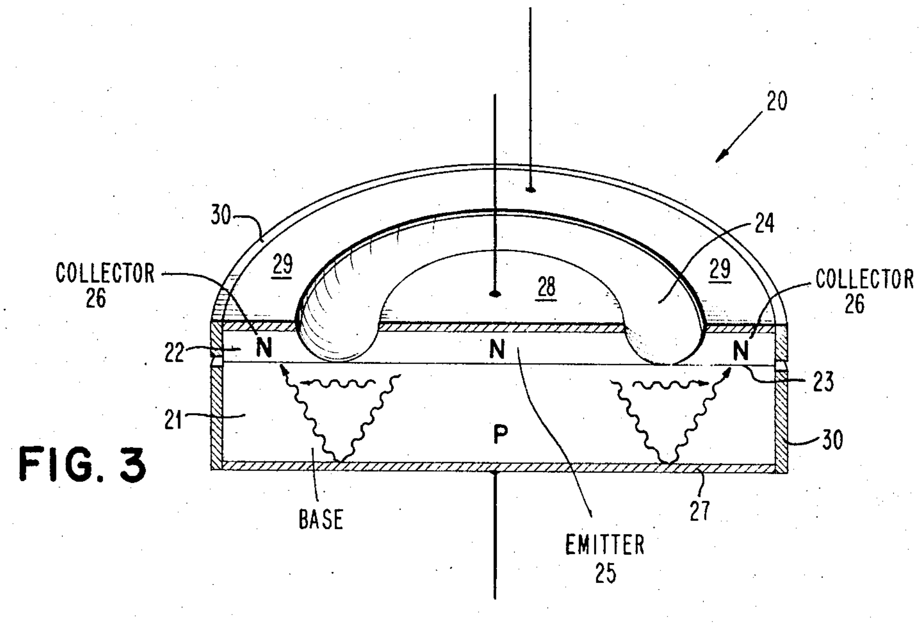
FIGURE 3 is a perspective view in section of a special configuration for the device of the present invention.

FIGURE 3 illustrates a special geometry that may be chosen for the device of the present invention. In order to achieve the particular configuration shown in FIGURE 3 the same basic initial steps are followed as was the case with the embodiment of FIGURE 1. Onto an original monocrystalline wafer, for example of n conductivity type, a diffusion operation is performed so as to convert the surface layer of the wafer to p conductivity type. After etching and lapping to remove the p conductivity layer on three sides, the thickness of the original n conductivity wafer is reduced and a semiconductor body, as shown in FIGURE 3 and labeled 20, is obtained. The body 20 is comprised of the aforesaid p conductivity type material in region 21 and of the thin layer 22 of n conductivity type. A junction 23 exists at the point of contact of the regions 21 and 22.

A trench 24 is now etched into the top surface of the structure down to the vicinity of junction 23 so as to delimit the separate concentric regions that constitute the emitter 25 and the collector 26 of the finished device. Top and bottom electrical contacts are made to the structure, the bottom contact 27 being affixed to the base region 21 by conventional means such as soldering or alloying. Separate contacts 28 and 29 are made to the emitter and collector regions respectively. If desired, the etched trench 24 may be filled with suitable material that will provide surface passivation and structural support.

A reflective coating 30 is preferably employed so as to surround the semiconductor structure thereby to enable the retention of the radiation within the semiconductor body 20 rather than allowing a portion of the total radiation to escape from the body. A metal coating may be used on the body 20 but, of course, in the case of a metal, it is necessary to avoid shorting the pin junction. Thus as shown in FIGURE 3 a gap is provided in the coating 20 adjacent to junction 23. In the alternative, the entire body including the junction may be covered initially with an insulator, having appropriate refractive index, and then the reflective metal coating may be superposed on this insulator.

The operation of the device in that configuration shown in FIGURE 3 is substantially the same as in the embodiment in FIGURE 1. However, the advantages of having the emitter and collector concentrically arranged and formed on one surface of the semiconductor body will be apparent. Such planar geometries have been found to be extremely useful in conventional transistor integrated design. Such design affords the convenience of making connections very easily to the device and the structure is inherently rugged.

It will be noted that identical properties are established for the spatially separated emitter base and collector base junctions because only one diffusion step is involved and the diffusion takes place on the same surface of the body in the formation of the separated junctions. The design of FIGURE 3, in addition, has the unique virtue that a relatively wide base region constituting the bulk of the total body can be used where light is the transport medium.

It should be apparent that with the structure of FIGURE 3, since light is thought to be generated on the p side of the emitting junction, where stimulated emission can be induced, propagation in a channel parallel to the junction will be promoted.

The photon radiation produced by the injection of charge carriers at or near the emitter base junction is indicated, as heretofore, by the symbol $h_\nu$. Several paths for this radiation are shown in FIGURE 3. The upper paths are direct ones from the radiation emitting junction to the radiation absorbing junction. The lower paths are indirect ones involving reflection from the previously formed ohmic contact 27.

The response times of experimental units have been measured to be as short as 5 nanoseconds. These times can be accounted for by considering the junction capacitance; however, the limits of the inherent speeds are not known. Some of these experimental units had an area of approximately 100 $mils^2$ and junction capacitances as low as 20 micromicrofarads (employing a load resistor of 50 ohms).

The table below lists a number of typical values for the several parameters of the present device. These values were taken from points on Iv characteristic curves, both input and output curves. It is obvious that significant power gain is realized, where power gain is represented by the symbol $P_G$.

lifetime. Hence for the same dimensions in a semiconductor device those of the present invention can be made faster for internal RC constants.

In their operation the devices of the present invention can function at temperatures from close to 0° K. up to temperatures where the semiconductor material becomes intrinsic. The intrinsic point is several hundred degrees C for GaAs.

A further notable advantage of the devices of the present invention is that the base region can be made degenerate. For GaAs the base region will be degenerate where the original wafer is doped, for example, with Te, to a concentration of approximately $5\times10^{17}$ a./cc. and will, of course, in this instance, be of n conductivity type. A degenerate base region of this character would not be useful for conventional transistors since the lifetime would be too low and the injection efficiency from emitter to base would concomitantly be too low.

The p type regions within the semiconductor body, as heretofore indicated, are ordinarily obtained by Zn diffusion. This diffusion operation is performed using a surface concentration of $10^{20}$ a./cc. and employing a temperature of 850° C. Of course alloying may also be used to create the requisite pn junctions within the semiconductor body. Several experimental units have been made where the alloying technique was used and tunnel diodes were created to serve as the light emitting and light collecting pn punctions.

As noted previously, although reference has been made throughout the specification to the use of GaAs for the body of the device other semiconductor compounds, particularly III–V compounds can just as well be employed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An optically coupled transistor comprising:

(a) a crystalline body of one semiconductor material selected from the group consisting of III–V compounds;

(b) doping means in said body providing first and second spaced rectifying junctions in the body;

(c) said doping means in said body providing on one side of said first junction as excess of electrons and on the other side of said first junction an excess of holes;

| | Current Gain α | | | | (Vc=2v) | | | | | | | |
|---|---|---|---|---|---|---|---|---|---|---|---|---|
| Ic=Vc | −7 | −2 | 0 | +1 | Ic | Ie | $Z_0$ | Zi | Zo/Zi | α | $\alpha^2$ | $P_G$ |
| 3.8 | .175 | .1 | .085 | .08 | 3.8 | 40 | 3K | 1.0 | $3\times10^3$ | .1 | $10\times10^{-3}$ | 30 |
| 2 | .16 | .095 | .080 | .07 | 2 | 20 | 54K | 1.1 | $4.5\times10^3$ | .095 | $9\times10^{-3}$ | 40 |
| 0.2 | .137 | .03 | .075 | .055 | 0.2 | 2 | 40K | 4 | $10\times10^3$ | .03 | $6.4\times10^{-3}$ | 64 |
| 0.02 | .113 | .064 | .050 | .026 | 0.02 | 0.1 | 500K | 100 | $5\times10^3$ | .064 | $4\times10^{-3}$ | 20 |

Improvement in the value of gain over those specified in the table above will be realized by such techniques as (1) using more efficient reflective coatings, (2) etching away more of the absorbing regions (such as the p regions near the surface in the several devices shown in the figures) and (3) by narrowing the base region.

In experiments, current gain, at room temperature, of 0.02 have been obtained and power gains above unity. Of course it will be understood that at approximately room temperature, output impedances are high.

What has been disclosed is a unique photon-coupled semiconductor device where radiation, due to injection of charge carriers, is the controlling feature. The device of the present invention is not plagued by normal transistor effects such as conductivity modulation, α crowding, etc. Hole storage effects are minimized due to the low (d) means applying a forward bias voltage across said first junction having an amplitude sufficient to inject electrons at said first junction;

(e) said excess electrons on said one side of said first junction responding to said forward bias by being injected in a direction across said junction toward the other side of said junction;

(f) said doping means on the other side of said junction providing a sufficient number of excess holes to recombine radiatively with a majority of the said injected electrons and produce recombination electromagnetic radiation at a frequency corresponding to an energy less than the band gap energy of said one semiconductor material;

(g) the portion of said one semiconductor material between said first and second junctions conducting the recombination radiation from said first to said second junction;

(h) the distance between said first and second junctions being greater than the average diffusion length for minority carriers in the semiconductor material between said junctions;

(i) means applying a bias to said second junction;

(j) said second junction responsive to said bias applied at said second junction to absorb said recombination radiation, generate charge carriers when the radiation is absorbed, and collect said charge carriers.

2. The optically coupled transistor of claim 1 including means at least partially surrounding the body of semiconductor material for reflecting said recombination radiation.

3. The optically coupled transistor of claim 1 wherein at least a portion of the semiconductor material on said other side of said first junction is degenerately doped.

4. The optically coupled transistor of claim 1 wherein said first side of said first junction is closer to said second junction than said other side of said first junction and said electrons injected at said first junction are injected in a direction away from said second junction.

5. An optically coupled transistor comprising:

(a) a crystalline body of one semiconductor material selected from the group consisting of III–V compounds;

(b) doping means in said body providing first and second spaced rectifying junctions in the body;

(c) said doping means in said body providing on one side of said first junction an excess of charge carriers of one conductivity type and on the other side of said first junction an excess of charge carriers of opposite conductivity type;

(d) means applying a forward bias voltage across said first junction having an amplitude sufficient to inject carriers at said junction;

(e) said excess charge carriers of one conductivity type on said one side of said first junction responding to said forward bias by being injected in a direction across said junction toward the other side of said junction;

(f) said doping means on the other side of said junction providing a sufficient number of excess charge carriers of opposite conductivity type to combine radiatively with a majority of the injected charge carriers of one conductivity type and produce recombination electromagnetic radiation at a frequency corresponding to an energy less than the band gap energy of said one semiconductor material;

(g) the portion of said one semiconductor material between said first and second junctions conducting the recombination radiation from said first to said second junction;

(h) the distance between said first and second junctions being greater than the average diffusion length for minority carriers in the semiconductor material between said junctions;

(i) means applying a bias to said second junction;

(j) and said second junction responsive to said bias applied at said junction to absorb said recombination radiation, generate charge carriers when the radiation is absorbed, and collect said charge carriers.

6. The optically coupled transistor of claim 5 including means at least partially surrounding the body of semiconductor material for reflecting said recombination radiation.

7. The optically coupled transistor of claim 5 wherein said III–V semiconductor material comprises gallium arsenide.

8. The optically coupled transistor of claim 7 wherein said gallium arsenide semiconductor material on said other side of said first junction is doped to degeneracy.

References Cited

UNITED STATES PATENTS

| | | | |
|---|---|---|---|
| 2,748,041 | 5/1956 | Leverenz | 317—235 X |
| 2,776,367 | 1/1957 | Lehovec | 250—211 X |
| 2,822,606 | 2/1958 | Yoshida | 29—25.3 |
| 2,829,422 | 4/1958 | Fuller | 29—25.3 |
| 2,861,165 | 11/1958 | Aigrain et al. | 250—211 X |
| 3,018,423 | 1/1962 | Aarons et al. | 317—234 |
| 3,027,501 | 3/1962 | Pearson | 317—234 |
| 3,043,958 | 7/1962 | Diemer | 317—235 X |
| 3,043,959 | 7/1962 | Diemer | 317—235 |
| 3,051,839 | 8/1962 | Carlson et al. | 250—211 |
| 3,053,998 | 9/1962 | Chynoweth et al. | 317—234 |
| 3,059,117 | 10/1962 | Boyle et al. | 250—211 |
| 3,064,132 | 11/1962 | Strull | 250—211 |
| 3,082,283 | 3/1963 | Anderson | 317—235 X |
| 3,096,442 | 7/1963 | Stewart | 250—211 |
| 3,134,905 | 5/1964 | Pfann | 250—211 |
| 3,200,259 | 8/1965 | Braunstein | 317—235 X |
| 3,207,939 | 9/1965 | Mason | 317—235 |
| 3,225,272 | 12/1965 | Cronemeyer | 317—235 |

OTHER REFERENCES

"Semiconductor Compounds Open New Horizons," by Abraham Coblenz, pp. R–4 and R–5, June 1958 (Midmonth) issue of Electronics' Buyers Guide.

"Recombination Radiation Emitted By GaAs," by Keyes et al., pp. 1822, 1823 of August 1962 edition (vol. 50) of I.R.E. Proceedings.

"Injection Electroluminescence," by A. T. Fischer in "Solid-State Electronics," Pergammon Press, pp. 232–246, 317–235.

JOHN W. HUCKERT, *Primary Examiner.*

WALTER STOLWEIN, *Examiner.*

A. M. LESNIAK, *Assistant Examiner.*